(12) United States Patent
Lee et al.

(10) Patent No.: US 11,125,914 B2
(45) Date of Patent: Sep. 21, 2021

(54) THREE-DIMENSIONAL GROUND MODEL GENERATION AND AUTOMATED EARTHWORK TARGET MODEL GENERATION SYSTEM BASED ON PARAMETER INPUT

(71) Applicants: Doosan Infracore Co., Ltd., Incheon (KR); IUCF-HYU (Industry-University Cooperation Foundation Hanyang University), Seoul (KR)

(72) Inventors: Seung Soo Lee, Seoul (KR); Min Sung Kang, Incheon (KR); Seung Man Yang, Yongin-si (KR); Woo Yong Jung, Seoul (KR); Jong Won Seo, Gimpo-si (KR)

(73) Assignees: DOOSAN INFRACORE CO., LTD., Seoul (KR); IUCF-HYU(INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 0 days.

(21) Appl. No.: 16/901,458

(22) Filed: Jun. 15, 2020

(65) Prior Publication Data

US 2020/0393595 A1    Dec. 17, 2020

(30) Foreign Application Priority Data

Jun. 14, 2019 (KR) .................. 10-2019-0070814

(51) Int. Cl.
*G01V 99/00* (2009.01)
*G06F 30/13* (2020.01)
(Continued)

(52) U.S. Cl.
CPC ............ *G01V 99/005* (2013.01); *E01C 23/01* (2013.01); *G06F 30/13* (2020.01); *G06T 17/05* (2013.01);
(Continued)

(58) Field of Classification Search
CPC ....... G01V 99/005; G06F 30/13; G06F 17/00; E01C 23/01; E01C 1/00; G06T 17/05;
(Continued)

(56) References Cited

U.S. PATENT DOCUMENTS 10,186,049 B1 * 1/2019 Boardman ................ G06T 7/75
2011/0316854 A1 * 12/2011 Vandrovec ............. G06T 17/20
   345/420

FOREIGN PATENT DOCUMENTS

CN   103927783 A * 7/2014
KR   20100116382 A * 11/2010

OTHER PUBLICATIONS

Goktepe, A. Burak, and A. Hilmi Lav. "Method for balancing cut-fill and minimizing the amount of earthwork in the geometric design of highways." Journal of transportation engineering 129.5 (2003). pp. 564-571. (Year: 2003).*

* cited by examiner

*Primary Examiner* — Kamini S Shah
*Assistant Examiner* — John E Johansen
(74) *Attorney, Agent, or Firm* — Hauptman Ham, LLP

(57) ABSTRACT

An earthwork target model generation system comprises a processor. The processor of the earthwork target model generation system stores a three-dimensional topography shape model and drill boring data in the target model generation system, generates a three-dimensional ground model using the three-dimensional topography shape model and the drill boring data, generates three-dimensional normal surface information in consideration of a design condi- (Continued)

tion for each rock quality using the three-dimensional ground model, and sets the design condition.

10 Claims, 9 Drawing Sheets

(51) Int. Cl.
*G06T 17/05* (2011.01)
*E01C 23/01* (2006.01)
*E21B 47/026* (2006.01)
*E21D 9/00* (2006.01)
*G06F 17/00* (2019.01)
*G06T 19/00* (2011.01)
*G06Q 50/08* (2012.01)
*E01C 1/00* (2006.01)

(52) U.S. Cl.
CPC ............... *E01C 1/00* (2013.01); *E21B 47/026* (2013.01); *E21D 9/00* (2013.01); *G06F 17/00* (2013.01); *G06Q 50/08* (2013.01); *G06T 19/00* (2013.01)

(58) Field of Classification Search
CPC ......... G06T 19/00; E21B 47/026; E21D 9/00; G06Q 50/08
USPC ...................................... 703/6, 10
See application file for complete search history.

US 11,125,914 B2

THREE-DIMENSIONAL GROUND MODEL GENERATION AND AUTOMATED EARTHWORK TARGET MODEL GENERATION SYSTEM BASED ON PARAMETER INPUT

CROSS-REFERENCE(S) TO RELATED APPLICATIONS

This application is based on and claims priority under 35 U.S.C. § 119(a) to Korean Patent Application No. 10-2019-0070814, filed on Jun. 14, 2019, in the Korean Intellectual Property Office, the disclosure of each of which is incorporated by reference herein in its entirety.

BACKGROUND OF THE DISCLOSURE

Field of the Disclosure

The present disclosure relates to a three-dimensional ground model generation and an automated earthwork target model generation system based on a parameter input, and to an automated earthwork target model generation system which automatically performs a three-dimensional normal surface design from a design reference boundary only by inputting normal surface design conditions for each rock layer using three-dimensional digital ground information.

Description of the Related Art

In the design of a normal surface, generally, the slope of the normal surface to be formed varies depending on the type of rock quality. The normal surface refers to a connecting surface of a portion of the inclined surface of the hill which forms a corresponding topography, or the middle portion of the land with different heights.

FIG. 1 is a diagram illustrating normal surface design conditions according to the type of rock quality and a design method for each rock layer. As illustrated in FIG. 1, a hard rock may have a high strength of rock quality, thereby maximizing the slope of the normal surface. A value of the slope ($\theta1$) is $\tan^{-1}(1/0.5)$, which is about 63.43°.

In the case of a soft rock, a value of the slope ($\theta2$) is $\tan^{-1}(1/0.8)$, which is about 51.34°; in the case of a weathering soil, a value of the slope ($\theta3$) is $\tan^{-1}(1/1)$, which is 45°; and in the case of a topsoil, a value of the slope ($\theta4$) is $\tan^{-1}(1/1.2)$, which is about 39.80°.

Conventionally, there has been an inconvenience in that in order for a designer to design the normal surface, in a two-dimensional design, the normal surface is required to be drawn one by one in consideration of a normal surface design value for each rock quality from a baseline in consideration of a ground information line displayed for each transverse cross section using a ground cross-sectional diagram.

Further, there is a hassle even in a three-dimensional design in that the designer is required to draw the line one by one for each rock layer from a baseline, and to generate surface data from the drawn line. The drill boring information, which determines the ground information, is schematic data and there is a hassle in that when the ground information is changed in a construction process, the designs of all normal surfaces are conventionally required to be performed again.

SUMMARY OF THE DISCLOSURE

The present disclosure is intended to solve the aforementioned problems, and one aspect of the present disclosure is to automatically design a three-dimensional normal surface from a design reference boundary only by inputting normal surface design conditions for each rock layer using three-dimensional digital ground information.

Further, another aspect of the present disclosure is to generate a three-dimensional ground model through an interpolation using drill boring information and three-dimensional topography information.

Further, still another aspect of the present disclosure is to provide an automated design system, which constructs a system configuring layer information in the form of three-dimensional surface data for each rock quality, and automatically generates a three-dimensional earthwork target drawing according to a set normal surface design parameter for each rock quality from a design reference boundary designed by a user when the user inputs normal surface design information for each rock quality to the system.

As means for solving the above problems, the present disclosure has exemplary embodiments with the following features.

An earthwork target model generation system according to an exemplary embodiment includes: an input module which stores a three-dimensional topography shape model and drill boring data in the system; a three-dimensional ground model generation module which generates a three-dimensional ground model using the three-dimensional topography shape model and the drill boring data which are input through the input module; a normal surface information generation module which generates three-dimensional normal surface information in consideration of a design condition for each rock quality using the three-dimensional ground model which is generated by the three-dimensional ground model generation module; and a normal surface condition setting module which sets the design condition.

The three-dimensional ground model generation module generates a three-dimensional borehole model using the drill boring information, and generates interpolation data through a linear interpolation in consideration of a depth value for each rock quality.

Further, the three-dimensional ground model generation module generates a rock layer line through the interpolation data, and generates a three-dimensional ground model by offsetting information of the three-dimensional topography shape model to the rock layer line.

Further, the three-dimensional ground model generation module generates layer information in the form of three-dimensional surface data for each rock quality.

The normal surface condition setting module includes: a design reference boundary setting engine which determines a design reference boundary corresponding to a starting line from which a normal surface design is started or an outermost line of an earthwork of the trenching; a design parameter setting engine which receives a design parameter for the altitude or gradient of the design reference boundary; and a normal surface generation direction setting engine which designates a direction in which a normal surface is to be generated for each surface if the design reference boundary is a closed poly-line form.

The normal surface information generation module includes: a ground condition recognition engine which analyzes whether there is a transverse change in the rock quality by recognizing ground conditions including the design reference boundary, and generates a new boundary line from a changing point if there is the change in the rock quality; an outermost point line generation engine which generates a line of a certain gradient at a starting point and an ending point of the design reference boundary, but generates the line of the gradient up to a boundary surface of a vertical condition in which the rock quality is changed; and an intersection point generation engine which generates an intersection point between the line of the gradient and a vertical boundary condition surface based on the vertical boundary condition analyzed by the ground condition recognition engine.

The ground condition recognition engine analyzes a vertical boundary condition of a rock quality associated with each boundary using a gradient value for each rock quality or normal surface design information for each ground condition classified as a condition of generating a berm.

An earthwork target model generation method according to an exemplary embodiment includes: inputting a three-dimensional topography shape model and drill boring data to a system; generating a three-dimensional ground model using the three-dimensional topography shape model and the drill boring data; generating three-dimensional normal surface information in consideration of a design condition for each rock quality using the three-dimensional ground model; and setting a normal surface condition which sets the design condition.

The generating of the three-dimensional ground model generates a three-dimensional borehole model using the drill boring information, and generates interpolation data through a linear interpolation in consideration of a depth value for each rock quality.

Further, the generating of the three-dimensional ground model generates a rock layer line through the interpolation data, generates a three-dimensional ground model by offsetting information of the three-dimensional topography shape model to the rock layer line, and generates layer information in the form of three-dimensional surface data for each rock quality.

The setting of the normal surface condition includes: setting a design reference boundary which determines a design reference boundary corresponding to a starting line from which a normal surface design is started or an outermost line of an earthwork of the trenching; setting a design parameter which receives a design parameter for the altitude or gradient of the design reference boundary; and setting a normal surface generation direction which designates a direction in which a normal surface is to be generated for each surface if the design reference boundary is a closed poly-line form.

The generating of the normal surface information includes: recognizing a ground condition which analyzes whether there is a transverse change in the rock quality by recognizing ground conditions including the design reference boundary, and generates a new boundary line from a changing point if there is the change in the rock quality; generating an outermost point line which generates a line of a certain gradient at a starting point and an ending point of the design reference boundary, but generates the line of the gradient up to a boundary surface of a vertical condition in which the rock quality is changed; and generating an intersection point between the line of the gradient and a vertical boundary condition surface based on the vertical boundary condition analyzed by the ground condition recognition engine.

The recognizing of the ground condition analyzes a vertical boundary condition of the rock quality associated with each boundary using a gradient value for each rock quality or normal surface design information for each ground condition which is classified as a condition of generating a berm.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DESCRIPTION OF CERTAIN INVENTIVE EMBODIMENTS

Hereinafter, exemplary embodiments of the present disclosure will be described in detail with reference to the accompanying drawings.

Figure 2:
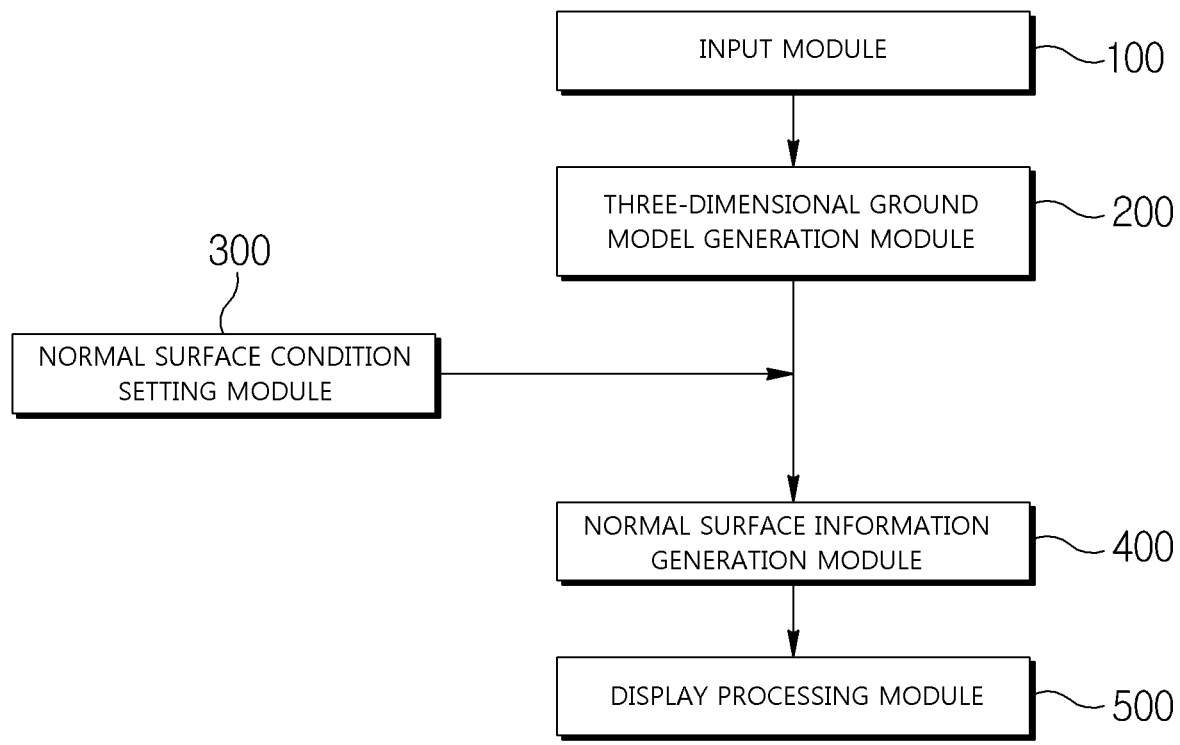
FIG. 2 is a block diagram of an earthwork target model system according to an exemplary embodiment.

FIG. 2 is a block diagram of an earthwork target model system according to an exemplary embodiment.

Referring to FIG. 2, an earthwork target model system according to the present disclosure includes an input module 100, a three-dimensional ground model generation module 200, a normal surface condition setting module 300, a normal surface information generation module 400, and a display processing module 500.

A physical configuration of the earthwork target model system according to the present disclosure may be configured as software (program) or hardware in a computer system such as a general PC or a web server.

The input module 100 stores a three-dimensional topography shape model and drill boring data in the system.

The three-dimensional ground model generation module 200 generates a three-dimensional borehole model using the drill boring information, and generates interpolation data through a linear interpolation in consideration of a depth value for each rock quality.

Further, the three-dimensional ground model generation module 200 generates a rock layer line through the interpolation data, and generates the three-dimensional ground model by offsetting the information of the three-dimensional topography shape model to the rock layer line.

Further, the three-dimensional ground model generation module 200 generates layer information in the form of three-dimensional surface data for each rock quality.

The normal surface condition setting module 300 sets design conditions of the normal surface information generation module 400 when the normal surface information generation module 400 generates normal surface information. That is, the normal surface condition setting module 300 severs to set the normal surface condition, which means to set condition information such as height, berm, and gradient related to the banking and cut earth of the normal surface. The normal surface condition setting module 300 includes a design reference boundary setting engine 310, a design parameter setting engine 320, and a normal surface generation direction setting engine 330.

Figure 3:
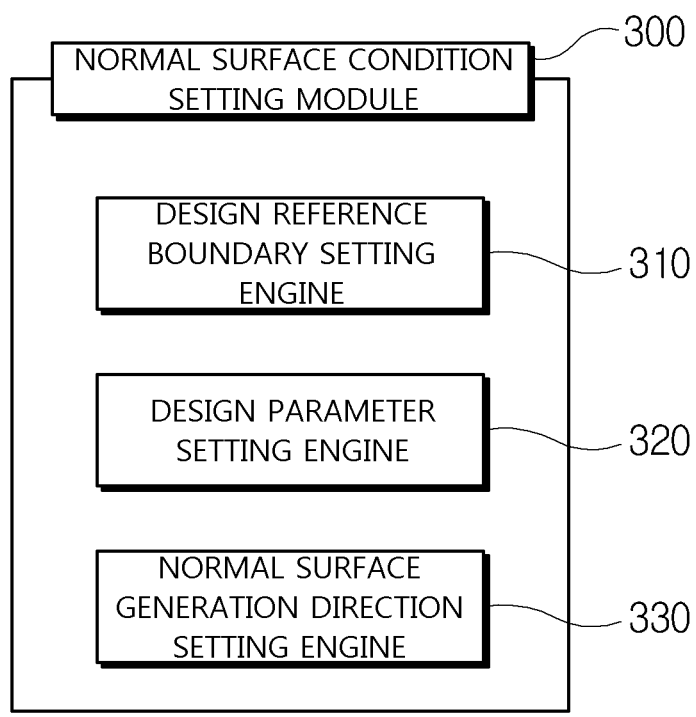
FIG. 3 is a block diagram of a normal surface condition setting module according to an exemplary embodiment.

FIG. 3 is a block diagram of a normal surface condition setting module according to an exemplary embodiment.

Referring to FIG. 3, the design reference boundary setting engine 310 determines a design reference boundary corresponding to a starting line from which a normal surface design is started or an outermost line of an earthwork of the trenching. That is, the design reference boundary means the outmost line of the earthwork in the case of the trench, and means design parameters for altitude and gradient in the case of the normal surface design. A system user may draw the design reference boundary on the display screen in a polyline or bring and output the design reference boundary from a two-dimensional floor plan.

The design parameter setting engine 320 receives design parameters for a step height or a gradient between the berms of the design reference boundary. A number of berms may be designed on the normal surface, and a difference in altitude between the respective berms may also be determined by law. The input design parameters are used to create a final design reference boundary.

The normal surface generation direction setting engine 330 designates a direction in which the normal surface is to be generated for each surface if the design reference boundary is a closed poly-line form. The direction may be designated by clicking a mouse by classifying the direction into left and right or up and down spaces with respect to the selected boundary line. Whether it is the trenching work or the banking work is determined depending upon the designated direction. Further, in the case of road work, the design reference boundary may also be linear rather than the closed poly-line form.

The normal surface information generation module 400 generates three-dimensional normal surface information in consideration of the design conditions for each rock quality using the three-dimensional ground model generated by the three-dimensional ground model generation module. The normal surface information generation module 400 includes a ground condition recognition engine 410, an outermost point line generation engine 420, and an intersection point generation engine 430.

Figure 4:
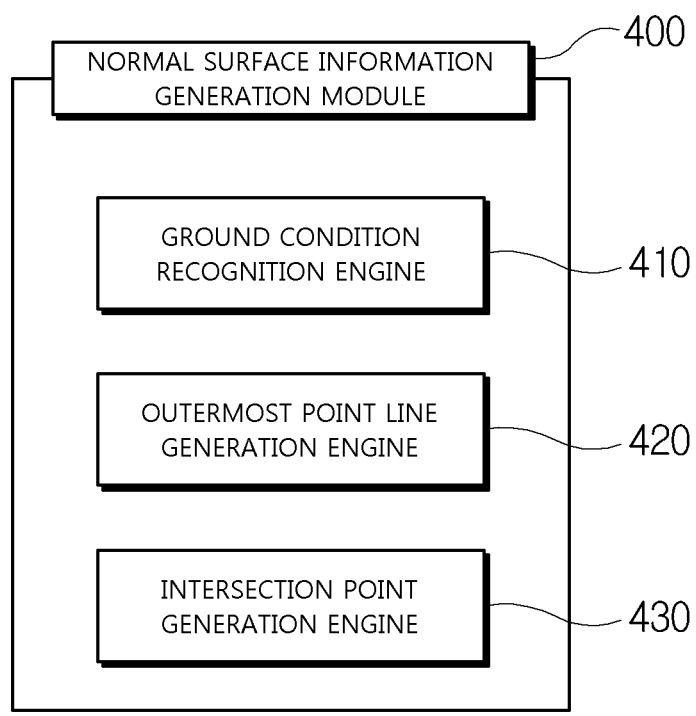
FIG. 4 is a block diagram of a normal surface information generation module according to an exemplary embodiment.

FIG. 4 is a block diagram of a normal surface information generation module according to an exemplary embodiment.

Figure 1:
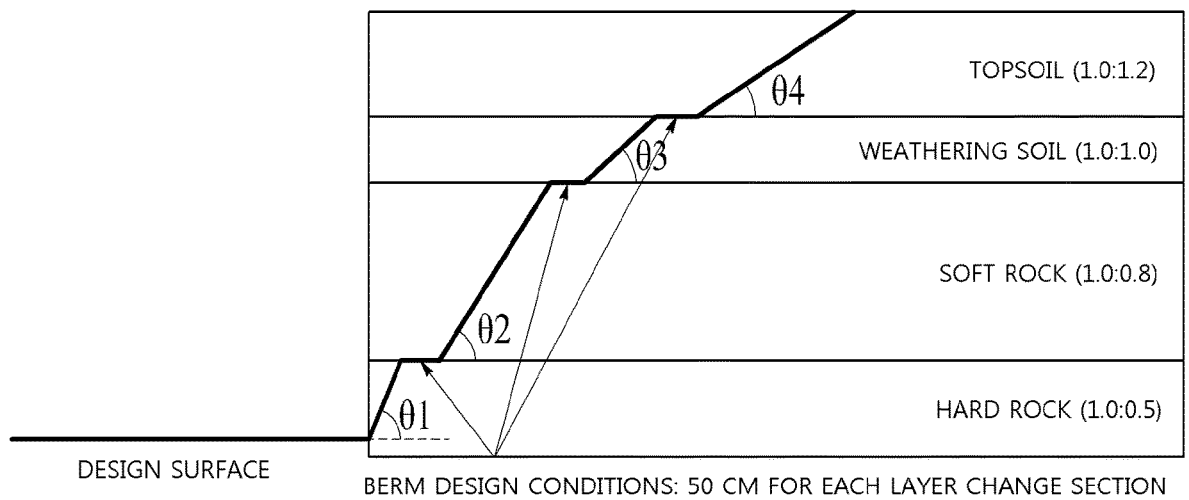
FIG. 1 is a diagram illustrating normal surface design conditions according to the type of rock quality and a design method for each rock layer.

Referring to FIG. 4, the ground condition recognition engine 410 recognizes the ground conditions including the design reference boundary to analyze whether there is a transverse change in the rock quality, and generates a new boundary line from a changing point when there is the change in the rock quality. Further, the ground condition recognition engine 410 analyzes vertical boundary conditions of the rock quality associated with each boundary using a gradient value for each rock quality or the normal surface design information for each ground condition classified as a condition of generating the berm. Here, the berm means to provide a stair-type free space in order to reduce the risk of collapse for each section where the gradient is changed or each certain altitude. The berm is also illustrated in FIG. 1, and the berm in FIG. 1 is set as 50 cm. This design method is called a stair-type design.

The outermost point line generation engine 420 generates a line of a certain gradient at the starting point and the ending point of the design reference boundary, but generates the line of the gradient up to the boundary surface of the vertical condition in which the rock quality is changed.

The intersection point generation engine 430 generates an intersection point between the line of the gradient and a vertical boundary condition surface based on the vertical boundary condition which is analyzed by the ground condition recognition engine.

Accordingly, the normal surface information generation module 400 generates three-dimensional normal surface information.

The display processing module 500 serves to automatically display the three-dimensional data and the resulting data on a display unit for each step in conjunction with the input module 100, the three-dimensional ground model generation module 200, the normal surface condition setting module 300, and the normal surface information generation module 400.

Figure 5:
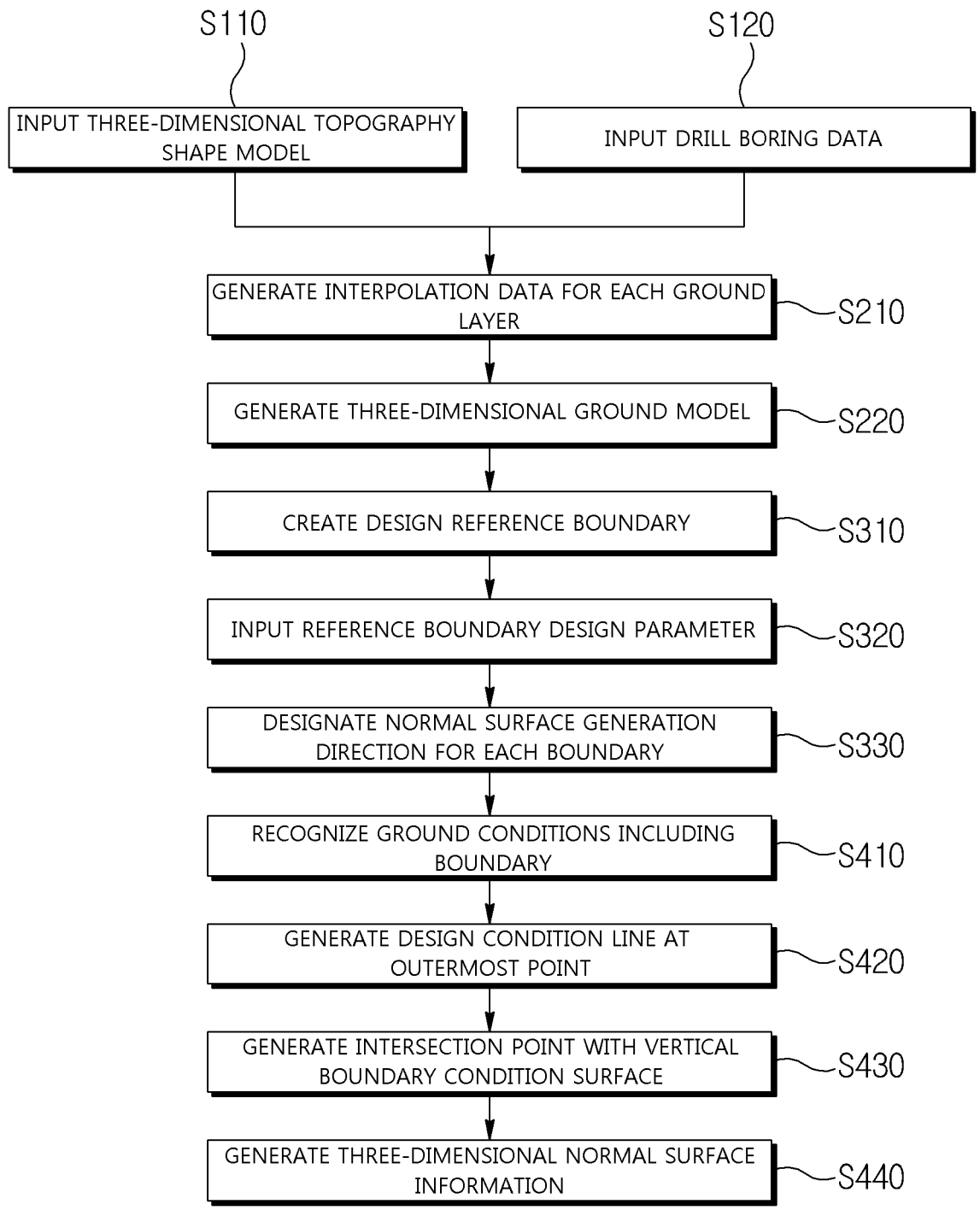
FIG. 5 is a flowchart illustrating an earthwork target model generation method according to an exemplary embodiment.

FIG. 5 is a flowchart illustrating an earthwork target model generation method according to an exemplary embodiment.

An earthwork target model generation method includes inputting a three-dimensional topography shape model (S110), inputting drill boring data into a system (S120), generating a three-dimensional borehole model using the drill boring information, and generating interpolation data through a linear interpolation in consideration of a depth value for each rock quality (S210), generating a three-dimensional ground model using the three-dimensional topography shape model and the drill boring data (S220), setting normal surface conditions which sets a design condition for each rock quality (S300), and generating three-dimensional normal surface information in consideration of the design condition for each rock quality using the three-dimensional ground model (S400).

The generating of the three-dimensional ground model (S220) may generate a rock layer line through the interpolation data, generate a three-dimensional ground model by offsetting information of a three-dimensional topography shape model to the rock layer line, and generate layer information in the form of three-dimensional surface data for each rock quality.

The setting of the normal surface conditions (S300) includes setting a design reference boundary which determines a design reference boundary corresponding to a starting line from which a normal surface design is started or an outmost line of an earthwork of the trenching (S310), setting design parameters which receives design parameters for the altitude or gradient of the design reference boundary (S320), and setting a normal surface generation direction which designates a direction in which the normal surface is to be generated for each surface if the design reference boundary is a closed poly-line form (S330).

The generating of the normal surface information (S400) includes recognizing ground conditions which analyzes whether there is a transverse change in the rock quality by recognizing ground conditions including the design reference boundary, and generates a new boundary line from a changing point if there is the change in the rock quality (S410), generating an outmost point line which generates a line of a certain gradient at a starting point and an ending point of the design reference boundary, but generates the line of the gradient up to the boundary surface of vertical conditions in which the rock quality is changed (S420), and generating an intersection point between the line of the gradient and a vertical boundary condition surface based on the vertical boundary conditions analyzed by the ground condition recognition engine (S430).

Figure 6:
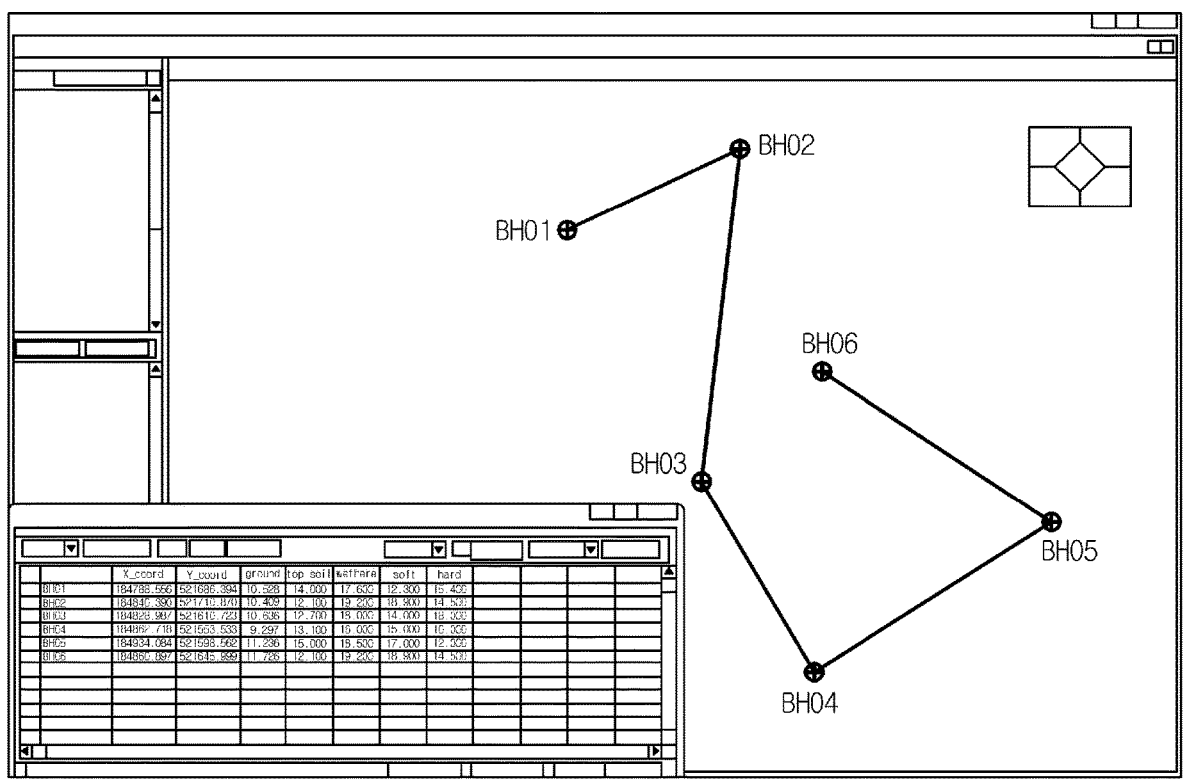
FIG. 6 is an exemplary diagram illustrating a process in which drill boring information is input to an input module according to an exemplary embodiment.

FIG. 6 is exemplary diagrams for explaining the process of generating a three-dimensional ground model using an earthwork target model system according to the present disclosure and generating an earthwork target model based on parameter input using the generated three-dimensional ground model according to an exemplary embodiment.

FIG. 6 is an exemplary diagram illustrating a process in which drill boring information is input to an input module according to an exemplary embodiment. FIG. 6 illustrates the input drill boring information (boring data) on a screen in the form of an Excel sheet, and it may be seen that the input drill boring information (boring data) name, drill (boring) coordinates (X, Y), and feature values (Z) for each bedrock are displayed on the screen.

Figure 7:
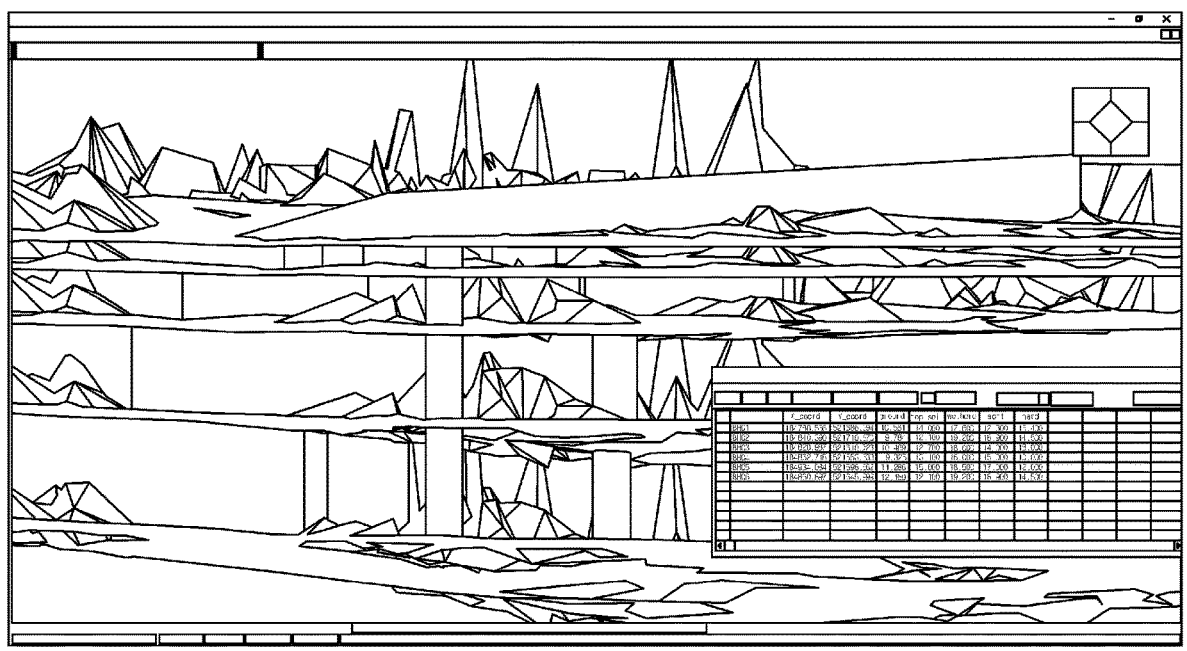
FIG. 7 is an exemplary diagram in which the three-dimensional ground model generation module generates layer information in the form of three-dimensional surface data for each rock quality according to an exemplary embodiment.
Figure 8:
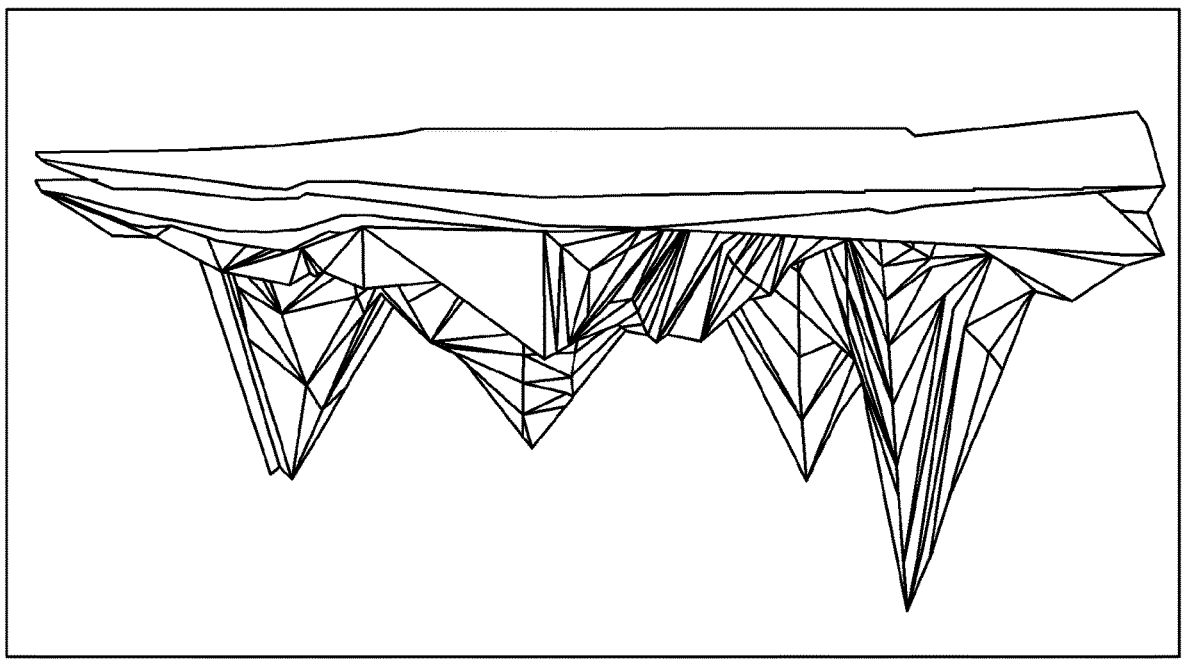
FIG. 8 is an exemplary diagram in which the three-dimensional ground model generation module generates layer information in the form of three-dimensional surface data for each rock quality according to an exemplary embodiment.

FIGS. 7 and 8 are exemplary diagrams in which the three-dimensional ground model generation module generates layer information in the form of three-dimensional surface data for each rock quality according to an exemplary embodiment.

Figure 9:
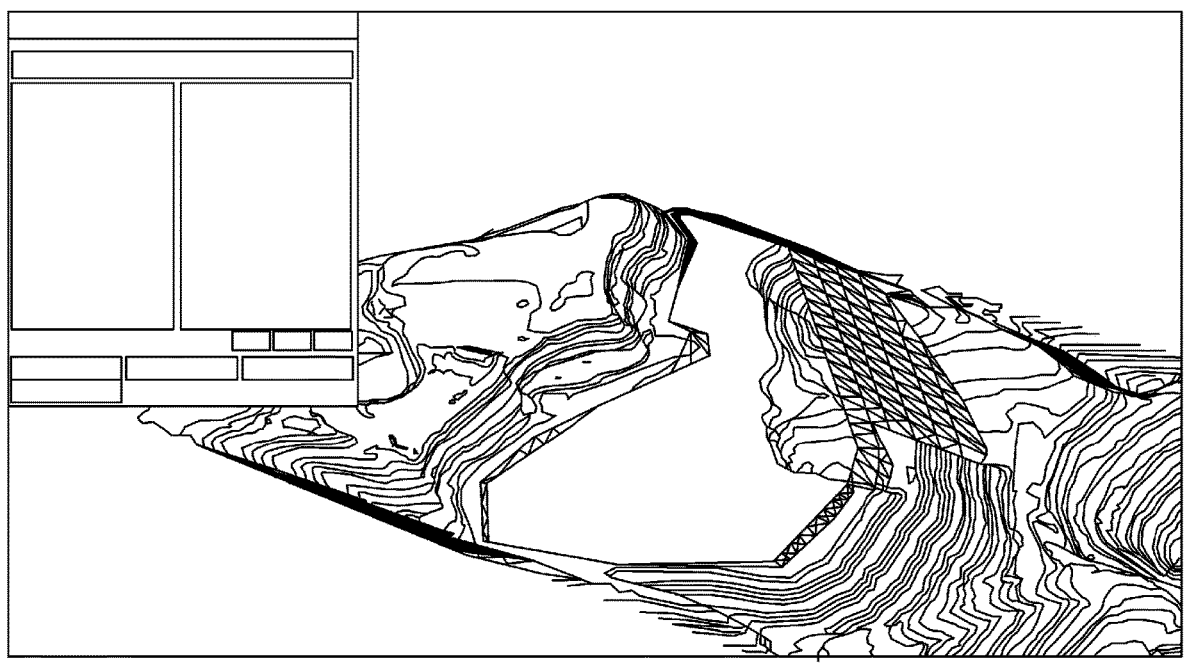
FIG. 9 illustrates the result of outputting normal surface earthwork target information in three dimensions using the earthwork target model system of the present disclosure according to an exemplary embodiment.

FIG. 9 is examples of drawing a three-dimensional target drawing based on parameter input according to an exemplary embodiment, and illustrate the results of outputting normal surface earthwork target information in three dimensions using the earthwork target model system according to the present disclosure.

As described above, the present disclosure may automatically generate three-dimensional normal surface information from the design reference boundary only by inputting the normal surface design condition for each rock layer using the three-dimensional digital ground information.

Further, the present disclosure may generate the automated three-dimensional ground model only by inputting the three-dimensional topography data and drill boring information, and automatically update all information only by updating the drill information even when the rock quality is changed, thereby largely reducing the time and the cost required for changing the design.

Although embodiments have been described with reference to a number of illustrative embodiments thereof, it should be understood that numerous other modifications and embodiments may be devised by those skilled in the art that will fall within the scope of the principles of this disclosure. More particularly, various variations and modifications are possible in the component parts and/or arrangements of the subject combination arrangement within the scope of the disclosure, the drawings and the appended claims. Further to variations and modifications in the component parts and/or arrangements, alternative uses will also be apparent to those skilled in the art.

What is claimed is:

1. An earthwork target model generation system comprising a processor, wherein said processor is configured to:
   store a three-dimensional topography shape model and drill boring information in the earthwork target model generation system;
   generate
      a three-dimensional borehole model using the drill boring information,
      interpolation data through a linear interpolation in consideration of a depth value for each rock quality of the drill boring information,
      a rock layer line through the interpolation data, and
      a three-dimensional ground model by offsetting information of the three-dimensional topography shape model to the rock layer line;
   receive a design parameter for an altitude or gradient of a design reference boundary corresponding to a starting line from which a normal surface is started and determine the design reference boundary based on the received design parameter;
   analyze a transverse change in the rock quality by using the generated three-dimensional ground model and the determined design reference boundary;
   analyzes vertical boundary conditions of the rock quality associated with the determined design reference boundary using a gradient value for each rock quality or normal surface design information for each ground condition classified as a condition of generating a berm; and
   generate three-dimensional normal surface information having an outermost point line of a certain gradient at a starting point and an ending point of the design reference boundary.

2. The earthwork target model generation system of claim 1, wherein the three-dimensional ground model includes layer information in the form of three-dimensional surface data for the each rock quality.

3. The earthwork target model generation system of claim 1, wherein the processor is configured to designate a direction in which a normal surface is to be generated for each surface.

4. The earthwork target model generation system of claim 1, wherein the processor is configured to generate a new boundary line from a changing point when the transverse change in the rock quality is recognized.

5. The earthwork target model generation system of claim 1, wherein the processor is configured to
   generate the outermost point line of the gradient up to a boundary surface of a vertical condition in which the rock quality is changed and
   generate an intersection point between the line of the gradient and a vertical boundary condition surface based on the vertical boundary condition.

6. An earthwork target model generation method, the method performed by an earthwork target model generation system having a processor, the method comprising:
   receiving and storing a three-dimensional topography shape model and drill boring information in the earthwork target model generation system;
   generating
      a three-dimensional borehole model using the drill boring information,
      interpolation data through a linear interpolation in consideration of a depth value for each rock quality of the drill boring information,
      a rock layer line through the interpolation data, and
      a three-dimensional ground model by offsetting information of the three-dimensional topography shape model to the rock layer line;

receiving a design parameter for an altitude or gradient of a design reference boundary corresponding to a starting line from which a normal surface is started and determining the design reference boundary based on the received design parameter;

analyzing a transverse change in the rock quality by using the generated three-dimensional ground model and the determined design reference boundary;

analyzing vertical boundary conditions of the rock quality associated with the determined design reference boundary using a gradient value for each rock quality or normal surface design information for each ground condition classified as a condition of generating a berm; and generating three-dimensional normal surface information having an outermost point line of a certain gradient at a starting point and an ending point of the design reference boundary.

7. The earthwork target model generation method of claim 6, wherein the three-dimensional ground model includes layer information in the form of three-dimensional surface data for the each rock quality.

8. The earthwork target model generation method of claim 6, the method further comprising: designating a direction in which a normal surface is to be generated for each surface.

9. The earthwork target model generation method of claim 6, generating a new boundary line from a changing point when the transverse change in the rock quality is recognized.

10. The earthwork target model generation method of claim 6, wherein the generating of the normal surface information comprises:

generating the outermost point line of the gradient up to a boundary surface of a vertical condition in which the rock quality is changed; and generating an intersection point between the line of the gradient and a vertical boundary condition surface based on the vertical boundary condition.

* * * * *